United States Patent
Park et al.

(10) Patent No.: US 9,543,505 B2
(45) Date of Patent: Jan. 10, 2017

(54) MAGNETIC MEMORY DEVICE AND METHOD FOR MANUFACTURING THE SAME

(71) Applicants: Sang Hwan Park, Hwaseong-si (KR); Kwangseok Kim, Seoul (KR); Keewon Kim, Suwon-si (KR); Jae Hoon Kim, Seoul (KR); Joonmyoung Lee, Suwon-si (KR)

(72) Inventors: Sang Hwan Park, Hwaseong-si (KR); Kwangseok Kim, Seoul (KR); Keewon Kim, Suwon-si (KR); Jae Hoon Kim, Seoul (KR); Joonmyoung Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/729,710

(22) Filed: Jun. 3, 2015

(65) Prior Publication Data
US 2016/0079520 A1    Mar. 17, 2016

(30) Foreign Application Priority Data

Sep. 12, 2014 (KR) .......................... 10-2014-0121124

(51) Int. Cl.
| H01L 43/08 | (2006.01) |
| H01L 43/10 | (2006.01) |
| H01L 43/12 | (2006.01) |
| H01L 29/82 | (2006.01) |
| H01L 27/22 | (2006.01) |

(52) U.S. Cl.
CPC ............. *H01L 43/08* (2013.01); *H01L 27/222* (2013.01); *H01L 29/82* (2013.01); *H01L 43/10* (2013.01); *H01L 43/12* (2013.01)

(58) Field of Classification Search
CPC .......... H01L 43/02; H01L 43/08; H01L 43/10; H01L 43/12; H01L 27/222
See application file for complete search history.

(56) References Cited

U.S. PATENT DOCUMENTS

| 7,430,135 B2 * | 9/2008 | Huai ....................... H01L 43/08 257/E43.004 |
| 8,063,459 B2 | 11/2011 | Ranjan et al. |

(Continued)

FOREIGN PATENT DOCUMENTS

JP          2012253207 A    12/2012

*Primary Examiner* — Savitr Mulpuri
(74) *Attorney, Agent, or Firm* — Harness, Dickey & Pierce, P.L.C.

(57) ABSTRACT

A memory device includes a magnetic tunnel junction comprising a first free layer, a pinned layer, and a tunnel barrier layer disposed between the first free layer and the pinned layer, wherein the first free layer comprises a first free magnetic pattern adjacent to the tunnel barrier layer, and a second free magnetic pattern spaced apart from the tunnel barrier layer with the first free magnetic pattern interposed therebetween, wherein the second free magnetic pattern contacts the first free magnetic pattern, wherein the first and second free magnetic patterns include boron (B), wherein a boron content of the first free magnetic pattern is higher than a boron content of the second free magnetic pattern, and wherein the boron content of the first free magnetic pattern is in a range of about 25 at % to about 50 at %.

15 Claims, 12 Drawing Sheets

(56) References Cited

U.S. PATENT DOCUMENTS

| | | | |
|---|---|---|---|
| 8,139,325 B2 * | 3/2012 | Tsunekawa | B82Y 10/00 360/324.2 |
| 8,278,123 B2 | 10/2012 | Choi et al. | |
| 8,545,999 B1 | 10/2013 | Leng et al. | |
| 8,559,219 B2 | 10/2013 | Uchida et al. | |
| 8,604,572 B2 * | 12/2013 | Wang | B82Y 25/00 257/421 |
| 8,852,760 B2 | 10/2014 | Wang et al. | |
| 9,184,375 B1 * | 11/2015 | Tang | H01L 43/08 |
| 9,184,376 B2 * | 11/2015 | Park | H01L 43/10 |
| 2008/0191295 A1 | 8/2008 | Ranjan et al. | |
| 2009/0161267 A1 * | 6/2009 | Kawai | B82Y 10/00 360/324.2 |
| 2010/0073828 A1 | 3/2010 | Wang et al. | |
| 2010/0078310 A1 | 4/2010 | Tsunekawa et al. | |
| 2011/0318848 A1 * | 12/2011 | Choi | B82Y 25/00 438/3 |
| 2012/0182796 A1 | 7/2012 | Uchida et al. | |
| 2013/0177781 A1 * | 7/2013 | Chepulskyy | G11C 11/161 428/811.1 |
| 2013/0221459 A1 * | 8/2013 | Jan | H01L 43/08 257/421 |
| 2013/0270523 A1 | 10/2013 | Wang et al. | |
| 2014/0015078 A1 * | 1/2014 | Huai | B82Y 25/00 257/421 |
| 2014/0038314 A1 | 2/2014 | Zhou | |

\* cited by examiner

MAGNETIC MEMORY DEVICE AND METHOD FOR MANUFACTURING THE SAME

CROSS-REFERENCE TO RELATED APPLICATION

This U.S. non-provisional patent application claims priority under 35 U.S.C. §119 to Korean Patent Application No. 10-2014-0121124, filed on Sep. 12, 2014, in the Korean Intellectual Property Office, the disclosure of which is hereby incorporated by reference in its entirety.

BACKGROUND

1. Technical Field

The inventive concepts relate to a semiconductor device and a method for manufacturing the same. More particularly, the inventive concepts relate to a magnetic memory device and a method for manufacturing the same.

2. Discussion of Related Art

Semiconductor devices are widely used in an electronic industry because of their small sizes, multi-functional characteristics, and/or low manufacturing costs. Semiconductor memory devices among semiconductor devices may store logical data. Magnetic memory devices of semiconductor memory devices are spotlighted as next-generation semiconductor memory devices because of their high-speed and/or non-volatile characteristics.

SUMMARY

Example embodiments of the inventive concepts may provide a magnetic memory device capable of improving reliability and tunneling magnetic resistance (TMR).

Example embodiments of the inventive concepts may also provide a method for manufacturing a magnetic memory device with improved reliability and tunneling magnetic resistance (TMR).

In one aspect, a magnetic memory device may include: a magnetic tunnel junction including a first free layer, a pinned layer, and a tunnel barrier layer disposed between the first free layer and the pinned layer. The first free layer may include: a first free magnetic pattern adjacent to the tunnel barrier layer; and a second free magnetic pattern spaced apart from the tunnel barrier layer with the first free magnetic pattern interposed therebetween. The second free magnetic pattern may be in contact with the first free magnetic pattern. The first and second free magnetic patterns may include boron (B). A boron content of the first free magnetic pattern may be higher than a boron content of the second free magnetic pattern, and the boron content of the first free magnetic pattern may be in a range of about 25 at % to about 50 at %.

In some example embodiments, the boron content of the second free magnetic pattern may be in a range of about 20 at % to about 35 at %.

In some example embodiments, a thickness of the first free magnetic pattern may be substantially equal to a thickness of the second free magnetic pattern.

In some example embodiments, a thickness of the first free layer may be in a range of about 10 Å to about 20 Å.

In some example embodiments, the first and second free magnetic patterns may include cobalt-iron-boron (CoFeB).

In some example embodiments, the pinned layer may include a plurality of pinned layers. The pinned layers may include: a first pinned layer adjacent to the tunnel barrier layer; and a second pinned layer spaced apart from the tunnel barrier layer with the first pinned layer interposed therebetween. The first and second pinned layers may include boron, and a boron content of the first pinned layer may be higher than a boron content of the second pinned layer.

In some example embodiments, the first pinned layer may include: a polarization enhancement magnetic pattern adjacent to the tunnel barrier layer; and a middle magnetic pattern spaced apart from the tunnel barrier layer with the polarization enhancement magnetic pattern interposed therebetween. The middle magnetic pattern may be in contact with the polarization enhancement magnetic pattern. A boron content of the middle magnetic pattern may be higher than a boron content of the polarization enhancement magnetic pattern and a boron content of the second pinned layer.

In some example embodiments, the boron content of the middle magnetic pattern may be substantially equal to the boron content of the first free magnetic pattern.

In some example embodiments, the middle magnetic pattern may include iron-boron (FeB).

In some example embodiments, the magnetic tunnel junction may further include: a non-magnetic metal layer adjacent to the first free layer; and a second free layer spaced apart from the first free layer with the non-magnetic metal layer interposed therebetween. The boron contents of the first and second free magnetic patterns may be higher than a boron content of the second free layer.

In some example embodiments, a thickness of the first free layer may be substantially equal to or greater than a thickness of the second free layer.

In some example embodiments, the magnetic memory device may further include a capping layer spaced apart from the non-magnetic metal layer with the second free layer interposed therebetween. In this case, the capping layer may be in contact with one surface of the second free layer to induce interfacial perpendicular magnetic anisotropy (i-PMA).

In some example embodiments, the magnetic tunnel junction may be disposed on a substrate, and the pinned layer may be disposed between the substrate and the tunnel barrier layer.

In some example embodiments, the magnetic tunnel junction may be disposed on a substrate, and the first free layer may be disposed between the substrate and the tunnel barrier layer.

In some example embodiments, the boron content of the first free magnetic pattern may be about 40 at %.

In another aspect, a magnetic memory device may include: a magnetic tunnel junction including a free layer, a pinned layer, and a tunnel barrier layer disposed between the free layer and the pinned layer. The free layer may include: a first free magnetic pattern adjacent to the tunnel barrier layer; and a second free magnetic pattern spaced apart from the tunnel barrier layer with the first free magnetic pattern interposed therebetween. The second free magnetic pattern may be in contact with the first free magnetic pattern. The first and second free magnetic patterns may include cobalt-iron-boron (CoFeB). A boron content of the first free magnetic pattern may be higher than a boron content of the second free magnetic pattern.

In some example embodiments, the pinned layer may include a polarization enhancement magnetic pattern adjacent to the tunnel barrier layer; and a middle magnetic pattern spaced apart from the tunnel barrier layer with the polarization enhancement magnetic pattern interposed therebetween. The middle magnetic pattern may be in contact with the polarization enhancement magnetic pattern. The middle magnetic pattern may include iron-boron (FeB), and a boron content of the middle magnetic pattern may be substantially equal to the boron content of the first free magnetic pattern.

In still another aspect, a method for manufacturing a magnetic memory device may include: forming a preliminary free layer, a preliminary pinned layer, and a preliminary tunnel barrier layer disposed therebetween on a substrate; and performing a thermal treatment process after forming the preliminary free layer, the preliminary pinned layer, and the preliminary tunnel barrier layer. The preliminary free layer may include: a first free magnetic layer adjacent to the preliminary tunnel barrier layer; and a second free magnetic layer spaced apart from the preliminary tunnel barrier layer with the first free magnetic layer interposed therebetween. The second free magnetic layer may be in contact with the first free magnetic layer. The first and second free magnetic layers may include boron. A boron content of the first free magnetic layer may be higher than a boron content of the second free magnetic layer, and the boron content of the first free magnetic layer may be in a range of about 25 at % to about 50 at %.

In some example embodiments, a process temperature of the thermal treatment process may be in a range of about 350° C. to about 450° C.

In some example embodiments, the boron content of the second free magnetic layer may be in a range of about 20 at % to about 35 at %.

BRIEF DESCRIPTION OF THE DRAWINGS

The inventive concepts will become more apparent in view of the attached drawings and accompanying detailed description.

DETAILED DESCRIPTION OF EXAMPLE EMBODIMENTS

Figure 1:
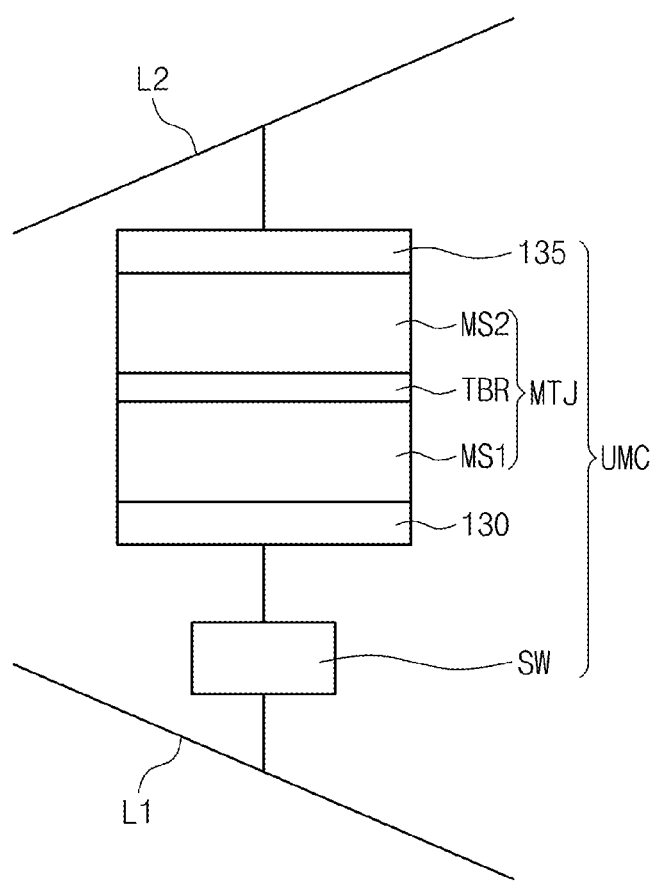
FIG. 1 is a circuit diagram illustrating a unit memory cell of a magnetic memory device according to example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, example embodiments of the inventive concepts are not limited to the specific examples provided herein and are exaggerated for clarity.

The terminology used herein is for the purpose of describing particular example embodiments only. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, example embodiments in the detailed description will be described with sectional views as ideal example views of the inventive concepts. Accordingly, shapes of the example views may be modified according to manufacturing techniques and/or allowable errors. Therefore, example embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some example embodiments could be termed a second element in other example embodiments without departing from the teachings of the present disclosure. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various example embodiments described herein may be embodied in microelectronic devices such as integrated circuits, wherein a plurality of devices according to various example embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various example embodiments described herein may include a plurality of the devices in an array and/or in a two-dimensional pattern that is based on the functionality of the microelectronic device.

The devices according to various example embodiments described herein may be interspersed among other devices depending on the functionality of the microelectronic device. Moreover, microelectronic devices according to various example embodiments described herein may be replicated in a third direction that may be orthogonal to the two different directions, to provide three-dimensional integrated circuits.

Accordingly, the cross-sectional view(s) illustrated herein provide support for a plurality of devices according to various example embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

A magnetic memory device may include a magnetic tunnel junction (MTJ) pattern. The MTJ pattern may include two magnetic layers and a barrier layer disposed therebetween. A resistance value of the MTJ pattern may be changed depending on magnetization directions of the two magnetic layers. For example, if the magnetization directions of the two magnetic layers are anti-parallel to each other, the MTJ pattern may have a relatively great resistance value. On the contrary, if the magnetization directions of the two magnetic layers are parallel to each other, the MTJ pattern may have a relatively small resistance value. Data may be written to or sensed from the MTJ pattern may by means of a difference between the resistance values.

FIG. 1 is a circuit diagram illustrating a unit memory cell of a magnetic memory device according to example embodiments of the inventive concepts.

Referring to FIG. 1, a unit memory cell UMC may be connected between a first interconnection L1 and a second interconnection L2 intersecting each other. The unit memory cell UMC may include a selection element SW and a magnetic tunnel junction MTJ. The selection element SW and the magnetic tunnel junction MTJ may be electrically connected in series to each other. One of the first and second interconnections L1 and L2 may be used as a word line, and the other of the first and second interconnections L1 and L2 may be used as a bit line.

The selection element SW may selectively control a flow of charges passing through the magnetic tunnel junction MTJ. For example, the selection element SW may be a diode, a PNP bipolar transistor, an NPN bipolar transistor, an NMOS field effect transistor, or a PMOS field effect transistor. If the selection element SW is the bipolar transistor or MOS field effect transistor corresponding to a three-terminal element, an additional interconnection may also be connected to the selection element SW.

The magnetic tunnel junction MTJ may include a first perpendicular magnetic structure MS1, a second perpendicular magnetic structure MS2, and a tunnel barrier layer TBR disposed between the first and second perpendicular magnetic structures MS1 and MS2. Each of the first and second perpendicular magnetic structures MS1 and MS2 may include at least one magnetic layer that is formed of a magnetic material. In some example embodiments, as illustrated in FIG. 1, the unit memory cell UMC may further include a first conductive structure 130 disposed between the first perpendicular magnetic structure MS1 and the selection element SW and a second conductive structure 135 disposed between the second perpendicular magnetic structure MS2 and the second interconnection L2.

Figure 2:
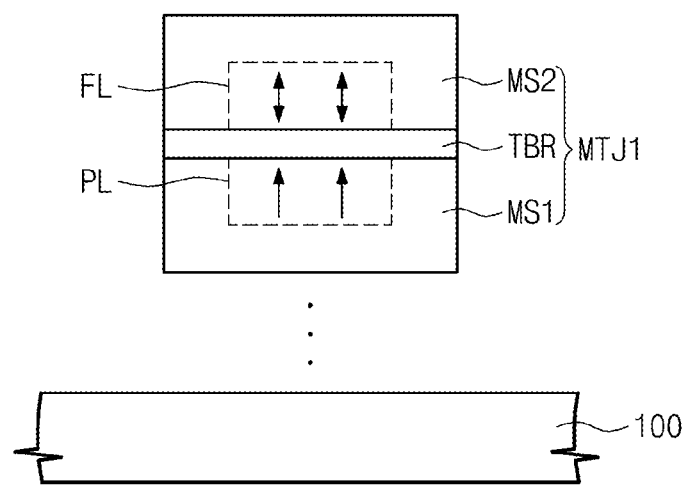
FIGS. 2 and 3 are diagrams illustrating magnetic tunnel junctions according to example embodiments of the inventive concepts.
Figure 3:
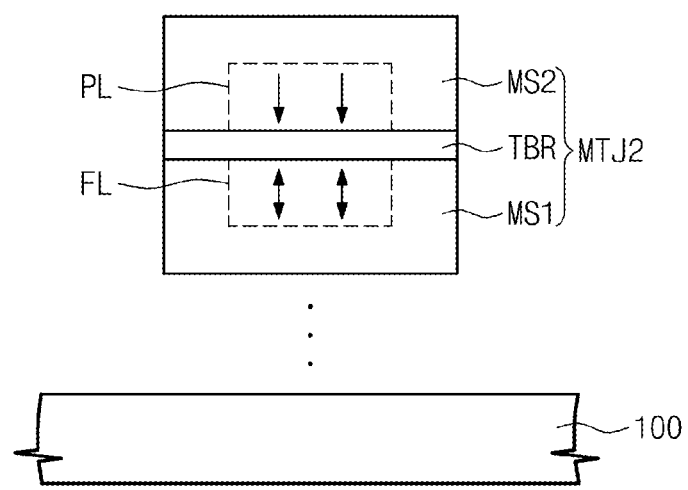

FIGS. 2 and 3 are diagrams illustrating magnetic tunnel junctions according to example embodiments of the inventive concepts.

Referring to FIGS. 2 and 3, a magnetization direction of one of the magnetic layer of the first perpendicular magnetic structure MS1 and the magnetic layer of the second perpendicular magnetic structure MS2 may be fixed regardless of an external magnetic field in a normal use environment. Hereinafter, the magnetic layer having the fixed magnetization direction is defined as a pinned layer PL. A magnetization direction of the other of the magnetic layers of the first and second perpendicular magnetic structures MS1 and MS2 may be switchable by an external magnetic field applied thereto. Hereinafter, the magnetic layer having the switchable magnetization direction is defined as a free layer FL. The magnetic tunnel junction MTJ may include at least one free layer FL and at least one pinned layer PL that are separated from each other by the tunnel barrier layer TBR.

An electrical resistance value of the magnetic tunnel junction MTJ may be dependent on the magnetization directions of the free layer FL and the pinned layer PL. In some example embodiments, the magnetic tunnel junction MTJ may have a first electrical resistance value when the magnetization directions of the free and pinned layers FL and PL are parallel to each other, and the magnetic tunnel junction MTJ may have a second electrical resistance value greater than the first electrical resistance value when the magnetization directions of the free and pinned layers FL and PL are anti-parallel to each other. As a result, the electrical resistance value of the magnetic tunnel junction MTJ may be controlled by changing the magnetization direction of the free layer FL. This is used as a data-storing principle in the magnetic memory device according to example embodiments of the inventive concepts.

The first and second perpendicular magnetic structures MS1 and MS2 constituting the magnetic tunnel junction MTJ may be sequentially stacked on a substrate 100, as illustrated in FIGS. 2 and 3. In this case, the magnetic tunnel junction MTJ may be one of two types according to a relative position of the free layer FL on the basis of the substrate 100 and/or a formation order of the free and pinned layers FL and PL. In some example embodiments, as illustrated in FIG. 2, the magnetic tunnel junction MTJ may be a first type magnetic tunnel junction MTJ1 of which the first and second perpendicular magnetic structures MS1 and MS2 includes the pinned layer PL and the free layer FL, respectively. In other example embodiments, as illustrated in FIG. 3, the magnetic tunnel junction MTJ may be a second type magnetic tunnel junction MTJ2 of which the first and second perpendicular magnetic structures MS1 and MS2 includes the free layer FL and the pinned layer PL, respectively.

Figure 4:
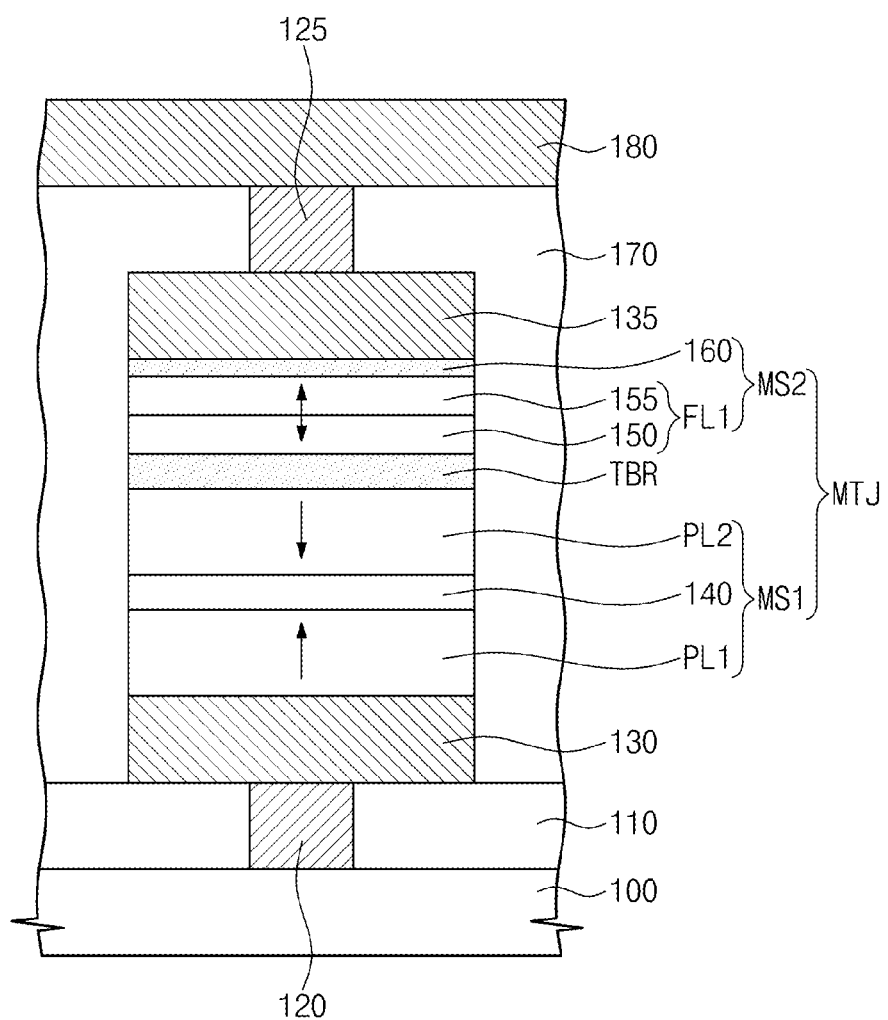
FIG. 4 is a cross-sectional view illustrating a magnetic memory device according to some example embodiments of the inventive concepts.

FIG. 4 is a cross-sectional view illustrating a magnetic memory device according to some example embodiments of the inventive concepts.

Referring to FIG. 4, a first dielectric layer 110 may be disposed on a substrate 100, and a lower contact plug 120 may penetrate the first dielectric layer 110. A bottom surface of the lower contact plug 120 may be electrically connected to one terminal of a selection element.

The substrate 100 may include at least one of materials having a semiconductor property, insulating materials, or a semiconductor or conductor covered with an insulating material. In some example embodiments, the substrate 100 may be a silicon wafer.

The first dielectric layer 110 may include at least one of an oxide (e.g., silicon oxide), a nitride (e.g., silicon nitride), or an oxynitride (e.g., silicon oxynitride). The lower contact plug 120 may include a conductive material. For example, the lower contact plug 120 may include at least one of a semiconductor doped with dopants (e.g., doped silicon, doped germanium, or doped silicon-germanium), a metal (e.g., titanium, tantalum, or tungsten), or a conductive metal nitride (e.g., titanium nitride or tantalum nitride).

A first conductive structure 130, a first perpendicular magnetic structure MS1, a tunnel barrier TBR, a second perpendicular magnetic structure MS2, and a second conductive structure 135 may be sequentially stacked on the first dielectric layer 110. The first conductive structure 130 may be electrically connected to a top surface of the lower contact plug 120. The first perpendicular magnetic structure MS1, the tunnel barrier layer TBR, and the second perpendicular magnetic structure MS2 may be included in a magnetic tunnel junction MTJ. The first conductive layer 130, the magnetic tunnel junction MTJ, and the second conductive structure 135 may have sidewalls that are aligned with each other. In some example embodiments, the sidewalls of the first conductive layer 130, the magnetic tunnel junction MTJ and the second conductive structure 135 may have an inclined profile.

The first perpendicular magnetic structure MS1 may include a first pinned layer PL1 on the first conductive structure 130, a second pinned layer PL2 on the first pinned layer PL1, and an exchange coupling layer 140 between the first and second pinned layers PL1 and PL2. In an embodiment, the first pinned layer PL1 may be disposed between the first conductive layer 130 and the exchange coupling layer 140, and the second pinned layer PL2 may be disposed between the exchange coupling layer 140 and the tunnel barrier layer TBR.

The second perpendicular magnetic structure MS2 may include a free layer FL1 disposed on the tunnel barrier layer TBR and a capping layer 160 disposed on the free layer FL1. In an embodiment, the free layer FL1 may be disposed between the tunnel barrier layer TBR and the capping layer 160.

The first and second pinned layers PL1 and PL2 may have magnetization directions that are substantially perpendicular to a top surface of the substrate 100. Likewise, a magnetization direction of the free layer FL1 may also be substantially perpendicular to the top surface of the substrate 100.

In an embodiment, the first pinned layer PL1 may have an easy axis substantially perpendicular to the top surface of the substrate 100. The magnetization direction of the first pinned layer PL1 may be fixed in one direction. The second pinned layer PL2 may have an easy axis substantially perpendicular to the top surface of the substrate 100. The magnetization direction of the second pinned layer PL2 may be fixed in anti-parallel to the magnetization direction of the first pinned layer PL1 by the exchange coupling layer 140.

The magnetization direction of the free layer FL1 may be changed to a direction parallel to or anti-parallel to the fixed magnetization direction of the second pinned layer PL2 by a program operation. The magnetization direction of the free layer FL1 may be changed by a spin torque transfer (STT) program operation. In other words, the magnetization direction of the free layer FL1 may be changed using spin torque of electrons included in a program current.

The first conductive structure 130 may include a seed layer used to form the magnetic tunnel junction MTJ and may act as an electrode electrically connecting the selection element to the magnetic tunnel junction MTJ. In some example embodiments, the first conductive structure 130 may include a first conductive layer and a second conductive layer that are sequentially stacked. For example, the first conductive layer may include tantalum (Ta) or cobalt-hafnium (CoHf), and the second conductive layer may include ruthenium (Ru). The second conductive structure 135 may be in contact with the capping layer 160 and may act as an electrode electrically connecting the magnetic tunnel junction MTJ to an interconnection 180. The second conductive structure 135 may have a single-layered or multi-layered structure including at least one of a noble metal layer, a magnetic alloy layer, or a metal layer. For example, the noble metal layer may include at least one of ruthenium (Ru), platinum (Pt), palladium (Pd), rhodium (Rh), or iridium (Ir). The magnetic alloy layer may include at least one of cobalt (Co), iron (Fe), or nickel (Ni), and the metal layer may include at least one of tantalum (Ta) and titanium (Ti). However, example embodiments of the inventive concepts are not limited to the materials described above.

The first pinned layer PL1 may include a perpendicular magnetic material. In some example embodiments, the first pinned layer PL1 may include at least one of cobalt-iron-terbium (CoFeTb) having a Tb content of 10% or more, cobalt-iron-gadolinium (CoFeGd) having a Gd content of 10% or more, cobalt-iron-dysprosium (CoFeDy), iron-platinum (FePt) having a $L1_0$ structure, iron-palladium (FePd) having the $L1_0$ structure, cobalt-palladium (CoPd) having the $L1_0$ structure, cobalt-platinum (CoPt) having the $L1_0$ structure, cobalt-platinum (CoPt) having a hexagonal close packed (HCP) lattice structure, or an alloy including at least one thereof. In other example embodiments, the first pinned layer PL1 may have a stack structure including magnetic layers and non-magnetic layers that are alternately and repeatedly stacked. For example, the stack structure may include $(Co/Pt)n$, $(CoFe/Pt)n$, $(CoFe/Pd)n$, $(Co/Pd)n$, $(Co/Ni)n$, $(CoNi/Pt)n$, $(CoCr/Pt)n$, or $(CoCr/Pd)n$ (where "n" denotes a natural number).

The exchange coupling layer 140 may exchange-couple the magnetization direction of the first pinned layer PL1 to the magnetization direction of the second pinned layer PL2 such that the magnetization direction of the first pinned layer PL1 is anti-parallel to the magnetization direction of the second pinned layer PL2. The exchange coupling layer 140 may couple the first and second pinned layers PL1 and PL2 by Ruderman-Klttel-Kasuya-Yosida (RKKY) interaction. Thus, magnetic fields generated by the magnetization directions of the first and second pinned layers PL1 and PL2 may offset each other to reduce or minimize a net magnetic field of the first perpendicular magnetic structure MS1. This means that it is possible to reduce or minimize the influence of the magnetic field of the first perpendicular magnetic structure MS1 on the free layer FL1. The exchange coupling layer 140 may include at least one of ruthenium (Ru), iridium (Ir), or rhodium (Rh).

In some example embodiments, the second pined layer PL2 may have a single-layered or multi-layered structure including at least one of cobalt-iron-boron (CoFeB), iron-boron (FeB), cobalt-iron-boron-tantalum (CoFeBTa), cobalt-hafnium (CoHf), cobalt (Co), or cobalt-zirconium (CoZr). In an embodiment, the second pinned layer PL2 may have a double-layered structure including a FeB layer and a CoFeB layer, a double-layered structure including a Co layer and a CoHf layer, or a double-layered structure including a CoFeBTa layer and a CoFeB layer.

The tunnel barrier layer TBR may be formed of a dielectric material. For example, the tunnel barrier layer TBR may include at least one of magnesium oxide (MgO) and aluminum oxide (AlO).

The free layer FL1 may include a first free magnetic pattern 150 on the tunnel barrier layer TBR and a second free magnetic pattern 155 on the first free magnetic pattern 150. In an embodiment, the first free magnetic pattern 150 may be in contact with the tunnel barrier layer TBR. The second free magnetic pattern 155 may be spaced apart from the tunnel barrier layer TBR with the first free magnetic pattern 150 interposed therebetween. The second free magnetic pattern 155 may be in contact with the first free magnetic pattern 150.

The first and second free magnetic patterns 150 and 155 may include boron (B). In more detail, the first and second free magnetic patterns 150 and 155 may include the same material. For example, the first and second free magnetic patterns 150 and 155 may include CoFeB in common. The first and second free magnetic patterns 150 and 155 may be crystallized by a thermal treatment process to improve a tunneling magnetic resistance (TMR) characteristic of the magnetic tunnel junction MTJ.

An atomic percent (at %) of boron in the first free magnetic pattern 150 may be in a range of 25 at % to 50 at %. A boron content of the second free magnetic pattern 155 may be lower than a boron content of the first free magnetic pattern 150. For example, an atomic percent of boron in the second free magnetic pattern 155 may be in a range of 20 at % to 35 at %. If the boron contents of the first and second free magnetic patterns 150 and 155 are lower than the lowest limits of the ranges described above, a crystallization characteristic of the free layer FL1 may be deteriorated and a critical current density (Jc) of the magnetic tunnel junction MTJ may be reduced. If the boron contents of the first and second free magnetic patterns 150 and 155 are higher than the upper limits of the ranges described above, the first and second free magnetic patterns 150 and 155 may be deteriorated by the thermal treatment process to reduce the TMR characteristic.

In some example embodiments, the boron content of the first free magnetic pattern 150 may be about 40 at %. In this case, the boron content of the second free magnetic pattern 155 may be in a range of about 20 at % to about 30 at %. In other words, the free layer FL1 may have a bi-layered structure that includes two layers including the same material but having composition contents different from each other. The two layers of the bi-layered structure may be indivisibly combined with each other.

A thickness of the first free magnetic pattern 150 may be substantially equal to a thickness of the second free magnetic pattern 155. A sum of the thicknesses of the first and second free magnetic patterns 150 and 155 (i.e., a thickness of the free layer FL1) may be in a range of 10 Å to 20 Å.

In a magnetic memory device, a CoFe layer deposited in an amorphous state may be crystallized using boron included in a free layer by a thermal treatment process. If a boron content of the free layer increases, the crystallization may be easily performed and a critical current density (Jc) may be reduced in a STT program operation. However, if the boron content of the free layer is higher than 25 at %, the free layer may be deteriorated by the thermal treatment process. Thus, a TMR characteristic may be reduced and perpendicular magnetic anisotropy may be deteriorated. In particular, if the magnetic memory device is exposed in a high-temperature thermal treatment process of 400° C. or more, a failure in switching operation of the free layer may be caused by increase in saturation magnetization (Ms) and increase in a resistance-area (RA) product value. Thus, the boron content of the free layer may be limited.

However, in example embodiments of the inventive concepts, the TMR characteristic of the magnetic tunnel junction MTJ was improved even though the boron content of each of the two layers (i.e., the first and second free magnetic patterns 150 and 155) of the free layer FL1 increased when the two layers had different boron concentrations from each other.

A value of the TMR of a single-layered free layer having a boron content of about 20 at % was in a range of 130% to 140%. On the other hand, the TMR had a first value in a case that the boron content of the first free magnetic pattern 150 was about 20 at % and the boron content of the second free magnetic pattern 155 was about 40 at % (hereinafter, referred to as 'a case CFB20/CFB40'). The TMR had a second value in a case that the boron content of the first free magnetic pattern 150 was about 40 at % and the boron content of the second free magnetic pattern 155 was about 20 at % (hereinafter, referred to as 'a case CFB40/CFB20'). The TMR had a third value in a case that the boron content of the first free magnetic pattern 150 was about 30 at % and the boron content of the second free magnetic pattern 155 was about 40 at % (hereinafter, referred to as 'a case CFB30/CFB40'). The TMR had a fourth value in a case that the boron content of the first free magnetic pattern 150 was about 40 at % and the boron content of the second free magnetic pattern 155 was about 30 at % (hereinafter, referred to as 'a case CFB40/CFB30'). The first, second, third and fourth values of the TMRs were in a range of about 150% to about 170%.

In addition, there were no significant differences between the critical current density (Jc) of the single-layered free layer having the boron content of about 20 at % and the critical current densities (Jc) of the cases CFB20/CFB40, CFB40/CFB20, CFB30/CFB40, and CFB40/CFB30. In other words, even though the boron content of at least one of the first and second free magnetic patterns 150 and 155 of the free layer FL1 is higher than 25 at %, the deterioration of the TMR characteristic is prevented.

Figure 11:
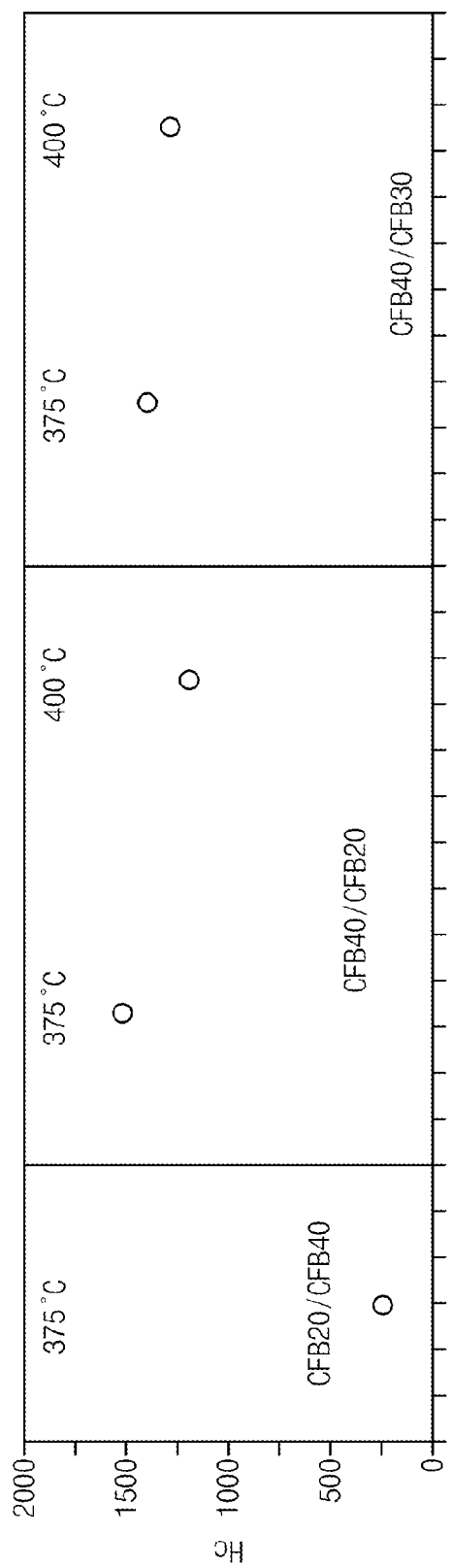
FIG. 11 is a graph illustrating distribution of a coercivity (Hc) according to variation in a boron content of each of first and second free magnetic patterns included in a magnetic memory device according to example embodiments of the inventive concepts.

FIG. 11 is a graph illustrating distribution of a coercivity (Hc) according to variation in a boron content of each of first and second free magnetic patterns 150 and 155 under thermal treatments of temperatures of 375° C. and 400° C.

Referring to FIG. 11, the coercivity (Hc) is more improved when the boron content of the first free magnetic pattern 150 adjacent to the tunnel barrier layer TBR is higher that of the second free magnetic pattern 155. A value of the coercivity (Hc) represents a data retention characteristic of the magnetic memory device. As the coercivity (Hc) characteristic increases, reliability of the magnetic memory device may be improved.

The coercivity (Hc) characteristic of the case CFB20/CFB40 is markedly low, but the coercivity (Hc) characteristics of the cases CFB40/CFB20 and CFB40/CFB30 are about five or more times greater than that of the case CFB20/CFB40. Thermal stabilities (Δ) of the cases CFB40/CFB20 and CFB40/CFB30 are greater than that of the case CFB20/CFB40.

Meanwhile, an Hc/Jc and a Δ/Jc represent a switching efficiency of the magnetic memory device. As described above, the Jc values of the cases CFB40/CFB20 and CFB40/CFB30 were similar to that of the single-layered free layer having the boron content of about 20 at %. However, the Hc values and the Δ values of the cases CFB40/CFB20 and CFB40/CFB30 were more improved. Thus, the switching efficiency of the case CFB40/CFB20 and the switching efficiency of the case CFB40/CFB30 are more improved.

As a result, since the boron content of the first free magnetic pattern 150 being in direct contact with the tunnel barrier layer TBR is higher than that of the second free magnetic pattern 155 in the free layer FL1 having the bi-layered structure, the TMR characteristic of the magnetic tunnel junction MTJ may be improved and the switching efficiency of the magnetic tunnel junction MTJ may also be improved.

Referring again to FIG. 4, the capping layer 160 may include a metal oxide. For example, the capping layer 160 may include at least one of tantalum oxide, magnesium oxide, titanium oxide, zirconium oxide, hafnium oxide, or zinc oxide. The capping layer 160 may assist the free layer FL1 in having the magnetization direction substantially perpendicular to the top surface of the substrate 100. A resistance value of the capping layer 160 may be equal to or smaller than one-third (⅓) of a resistance value of the tunnel barrier layer TBR.

A second dielectric layer 170 may be disposed on an entire top surface of the substrate 100 to cover the first conductive structure 130, the magnetic tunnel junction MTJ, and the second conductive structure 135. An upper contact plug 125 may penetrate the second dielectric layer 170 so as to be connected to the second conductive structure 135. The second dielectric layer 170 may include at least one of an oxide (e.g., silicon oxide), a nitride (e.g., silicon nitride), or an oxynitride (e.g., silicon oxynitride). The upper contact plug 125 may include at least one of a metal (e.g., titanium, tantalum, copper, aluminum, or tungsten) and a conductive metal nitride (e.g., titanium nitride or tantalum nitride).

The interconnection 180 may be disposed on the second dielectric layer 170. The interconnection 180 may be connected to the upper contact plug 125. The interconnection 180 may include at least one of a metal (e.g., titanium, tantalum, copper, aluminum, or tungsten) and a conductive metal nitride (e.g., titanium nitride or tantalum nitride). In some example embodiments, the interconnection 180 may be a bit line.

Figure 5A:
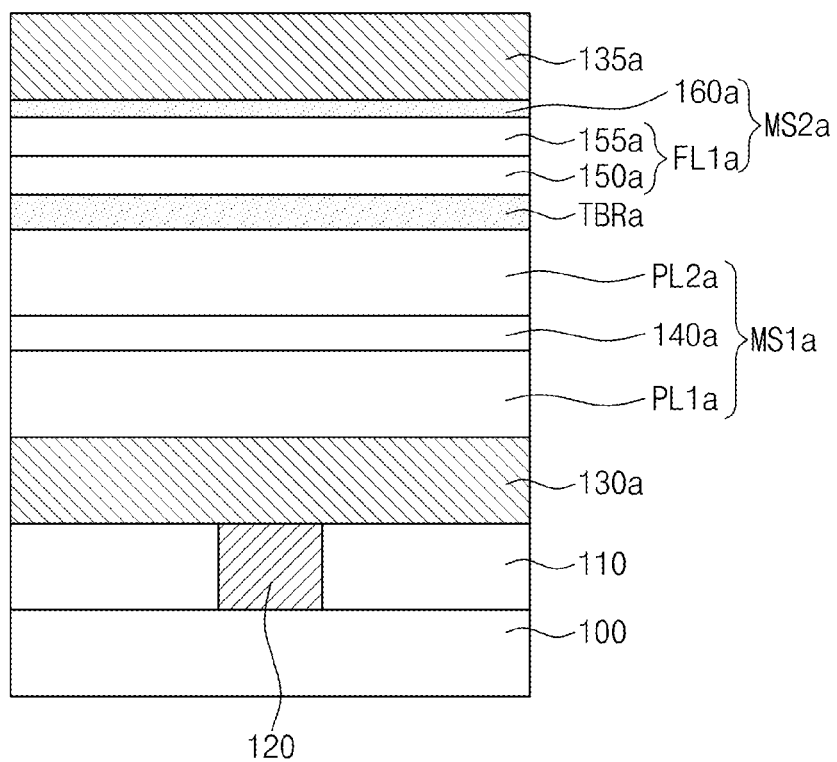
FIGS. 5A and 5B are cross-sectional views illustrating a method for manufacturing a magnetic memory device according to some example embodiments of the inventive concepts.
Figure 5B:
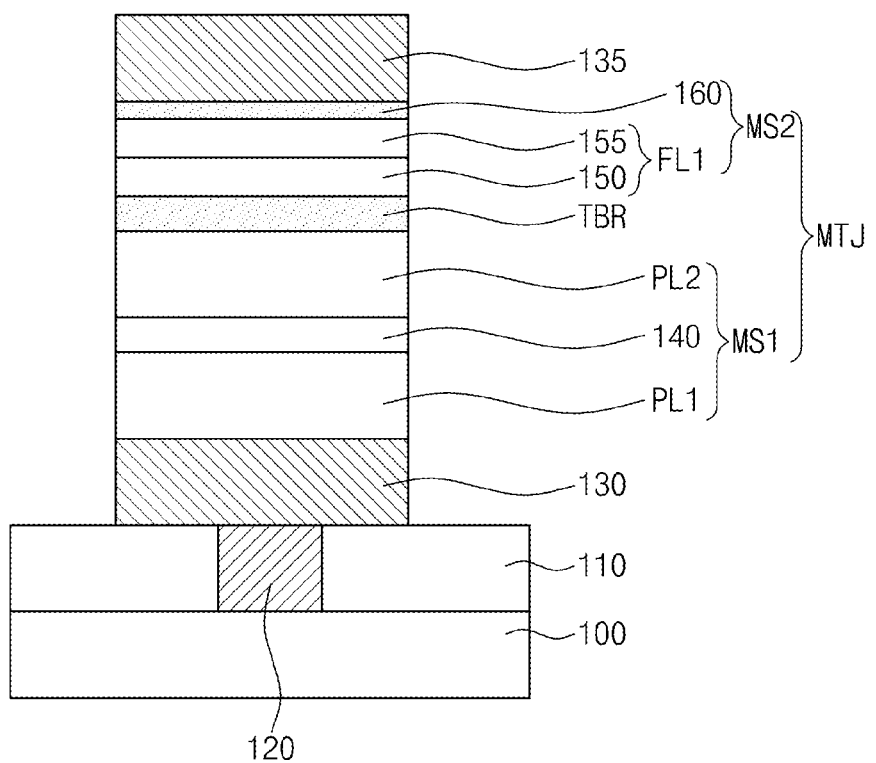

FIGS. 5A and 5B are cross-sectional views illustrating a method for manufacturing a magnetic memory device according to some example embodiments of the inventive concepts.

Referring to FIG. 5A, a first dielectric layer 110 may be formed on a substrate 100. A lower contact plug 120 may be formed to penetrate the first dielectric layer 110. A first preliminary conductive structure 130a may be formed on the first dielectric layer 110. The first preliminary conductive structure 130a may be electrically connected to a top surface of the lower contact plug 120.

Even though not shown in the drawings, a seed layer may be deposited on the first preliminary conductive structure 130a. The seed layer may be deposited by a physical vapor deposition (PVD) process, a chemical vapor deposition (CVD) process, or an atomic layer deposition (ALD) process. In some example embodiments, the seed layer may be deposited by a sputtering process corresponding to one kind of the PVD process.

A first preliminary perpendicular magnetic structure MS1a may be formed on the seed layer. The first preliminary perpendicular magnetic structure MS1a may include a first preliminary pinned layer PL1a, a preliminary exchange coupling layer 140a, and a second preliminary pinned layer PL2a.

In detail, the first preliminary pinned layer PL1a may be deposited on the seed layer. The first preliminary pinned layer PL1a may be formed using the seed layer as a seed. In some example embodiments, the first preliminary pinned layer PL1a may have the same crystal structure as the seed layer. The first preliminary pinned layer PL1a may include a perpendicular magnetic material. For example, the material of the first preliminary pinned layer PL1a may be the same as that of the first pinned layer PL1 described with reference to FIG. 4.

The first preliminary pinned layer PL1a may be deposited by a PVD process, a CVD process, or an ALD process. In some example embodiments, the first preliminary pinned layer PL1a may be deposited by a sputtering process. If the first preliminary pinned layer PL1a is formed of a cobalt-platinum (CoPt) alloy, the first preliminary pinned layer PL1a may be deposited by a sputtering process using an argon (Ar) gas. In this case, to reduce saturation magnetization of the first preliminary pinned layer PL1a, the first preliminary pinned layer PL1a may be formed of a CoPt alloy doped with boron.

The preliminary exchange coupling layer 140a may be deposited on the first preliminary pinned layer PL1a. In some example embodiments, the preliminary exchange coupling layer 140a may be formed using the first preliminary pinned layer PL1a as a seed. For example, the preliminary exchange coupling layer 140a may be formed of ruthenium having a HCP lattice structure. The preliminary exchange coupling layer 140a may be deposited by a PVD process, a CVD process, or an ALD process. In some example embodiments, the preliminary exchange coupling layer 140a may be deposited by a sputtering process.

The second preliminary pinned layer PL2a may be formed on the preliminary exchange coupling layer 140a. The second preliminary pinned layer PL2a may be formed using the preliminary exchange coupling layer 140a as a seed. In some example embodiments, the second preliminary pinned layer PL2a may have the same crystal structure as the preliminary exchange coupling layer 140a. The second preliminary pinned layer PL2a may include a perpendicular magnetic material. For example, the material of the second preliminary pinned layer PL2a may be the same as that of the second pinned layer PL2 described with reference to FIG. 4. The second preliminary pinned layer PL2a may be deposited by a PVD process, a CVD process, or an ALD process. In some example embodiments, the second preliminary pinned layer PL2a may be deposited by a sputtering process.

A preliminary tunnel barrier layer TBRa may be formed on the second preliminary pinned layer PL2a. In some example embodiments, the preliminary tunnel barrier layer TBRa may be formed by a sputtering process using a tunnel barrier material as a target. The target may include the tunnel barrier material of which stoichiometry is accurately controlled. By the sputtering process using the target, the preliminary tunnel barrier layer TBRa with superior quality may be deposited on the second preliminary pinned layer PL2a. Thus, thermo-stability of the preliminary tunnel barrier layer TBRa may be improved. For example, the preliminary tunnel barrier layer TBRa may be formed of at least one of magnesium oxide (MgO) and/or aluminum oxide (AlO). In some example embodiments, the preliminary tunnel barrier layer TBRa may be formed of magnesium oxide (MgO) having a sodium-chloride (NaCl) crystal structure.

A second preliminary perpendicular magnetic structure MS2a may be formed on the preliminary tunnel barrier layer TBRa. The second preliminary perpendicular magnetic structure MS2a may include a preliminary free layer FL1a and a preliminary capping layer 160a. The preliminary free layer FL1a may include a first free magnetic layer 150a and a second free magnetic layer 155a.

The first free magnetic layer 150a and the second free magnetic layer 155a may be sequentially formed on the preliminary tunnel barrier layer TBRa. For example, the first and second free magnetic layers 150a and 155a may be formed of cobalt-iron-boron (CoFeB).

An atomic percent (at %) of boron in the first free magnetic layer 150a may be in a range of 25 at % to 50 at %. A boron content of the second free magnetic layer 155a may be smaller than a boron content of the first free magnetic layer 150a. For example, an atomic percent of boron in the second free magnetic layer 155a may be in a range of 20 at % to 35 at %. If the boron contents of the first and second free magnetic layers 150a and 155a are lower than the lowest limits of the ranges described above, a crystallization characteristic of a free layer FL1 to be formed later may be deteriorated and a critical current density (Jc) may be reduced. If the boron contents of the first and second free magnetic layers 150a and 155a are higher than the upper limits of the ranges described above, the first and second free magnetic layers 150a and 155a may be deteriorated by the thermal treatment process to be performed later. Thus, a magnetic tunnel resistance (TMR) characteristic may be reduced.

In some example embodiments, the boron content of the first free magnetic layer 150a may be about 40 at %. In this case, the boron content of the second free magnetic layer 155a may be in a range of about 20 at % to about 30 at %. In other words, the preliminary free layer FL1a may have a bi-layered structure that includes two layers including the same material but having composition contents different from each other. The two layers of the bi-layered structure may be indivisibly combined with each other.

The first and second free magnetic layers 150a and 155a may be sequentially deposited by at least one of a PVD process, a CVD process, or an ALD process. In some example embodiments, the first and second free magnetic layers 150a and 155a may be deposited by a sputtering process. The deposited first and second free magnetic layers 150a and 155a may be in an amorphous state.

A thermal treatment process may be performed after the formation of the first and second free magnetic layers 150a and 155a. The first and second free magnetic layers 150a and 155a may be crystallized by the thermal treatment process. Thus, the first and second magnetic layers 150a and 155a may exhibit the TMR characteristic. In other words, the first and second free magnetic layers 150a and 155a may obtain a high magnetic resistance ratio. To obtain a sufficient magnetic resistance ratio, the thermal treatment process may be performed at a high temperature of 350° C. to 450° C. If a process temperature of the thermal treatment process is lower than 350° C., the sufficient magnetic resistance ratio may not be obtained. If the process temperature of the thermal treatment process is higher than 450° C., a failure in a switching operation may occur by increase in saturation magnetization (Ms) and increase in a RA value. In some example embodiments, the thermal treatment process may be performed at a high-temperature of about 400° C.

The first and second free magnetic layers 150a and 155a may be crystallized using the preliminary tunnel barrier layer TBRa as a seed during the thermal treatment process. In some example embodiments, the preliminary tunnel barrier layer TBRa may have the sodium-chloride crystal structure, and the first and second free magnetic layers 150a and 155a may be crystallized to form a body centered cubic (BCC) crystal structure.

If the deposited second preliminary pinned layer PL2a includes an amorphous iron-boron (FeB) layer, the second preliminary pinned layer PL2a may be crystallized by the thermal treatment process. At this time, boron in the iron-boron (FeB) may be diffused to improve a crystallization rate of the iron-boron (FeB).

In other example embodiments, the deposited first and second free magnetic layers 150a and 155a may be partially crystalline, and the first and second free magnetic layers 150a and 155a may be fully crystallized by the thermal treatment process.

In a method of fabricating a magnetic memory device, a thermal treatment process may be performed at a temperature of about 350° C. If the thermal treatment process is performed at a high temperature greater than 350° C. in the general method, a RA value of a free layer may be greatly increased. However, according to example embodiments of the inventive concepts, since the preliminary free layer FL1a has the bi-layered structure including the two layers of which boron concentrations are different from each other, the increase in the RA value may be minimized or prevented even though the boron content of each of the two layers (i.e., the first and second free magnetic layers 150a and 155a) increases.

In detail, when the boron content of the first free magnetic layer 150a was about 30 at % and the boron content of the second free magnetic layer 155a was about 40 at % (CFB30/CFB40), a RA value after the thermal treatment process of 400° C. was increased by about 20% as compared to a RA value after the thermal treatment process of 375° C. On the other hand, when the boron content of the first free magnetic layer 150a was about 40 at % and the boron content of the second free magnetic layer 155a was about 30 at % (CFB40/CFB30), a RA value after the thermal treatment process of 400° C. was increased by about 5% as compared to a RA value after the thermal treatment process of 375° C.

As a result, since the boron content of the first free magnetic layer 150a being in direct contact with the preliminary tunnel barrier layer TBRa is higher than that of the second free magnetic layer 155a in the preliminary free layer FL1a, resistance of the preliminary free layer FL1a to a high-temperature process may be improved.

A preliminary capping layer 160a and a second preliminary conductive structure 135a may be sequentially formed on the preliminary free layer FL1a. In some example embodiments, the thermal treatment process may be performed after the formation of the second preliminary conductive structure 135a. In other example embodiments, the thermal treatment process may be performed after the formation of the preliminary free layer FL1a and before the formation of the preliminary capping layer 160a. In still other example embodiments, the thermal treatment process may be performed after the formation of the preliminary capping layer 160a and before the formation of the second preliminary conductive structure 135a.

The preliminary capping layer 160a may be formed of at least one of tantalum oxide, magnesium oxide, titanium oxide, zirconium oxide, hafnium oxide, or zinc oxide. The second preliminary conductive structure 135a may have a single-layered or multi-layered structure including at least one of noble metal layers, magnetic alloy layers, or metal layers. For example, the material of the second preliminary conductive structure 135a may be the same as that of the second conductive structure 135 described with reference to FIG. 4.

Referring to FIG. 5B, the second preliminary conductive structure 135a, the preliminary capping layer 160a, the preliminary free layer FL1a, the preliminary tunnel barrier layer TBRa, the second preliminary pinned layer PL2a, the preliminary exchange coupling layer 140a, the first preliminary pinned layer PL1a, and the first preliminary conductive structure 130a may be sequentially patterned to form a first conductive structure 130, a first pinned layer PL1, an exchange coupling layer 140, a second pinned layer PL2, a tunnel barrier layer TBR, a free layer FL1, a capping layer 160, and a second conductive structure 135 which are sequentially stacked. The free layer FL1 may include a first free magnetic pattern 150 on the tunnel barrier layer TBR and a second free magnetic pattern 155 on the first free magnetic pattern 150.

Referring to FIG. 4, a second dielectric layer 170 may be formed to cover the first conductive structure 130, the magnetic tunnel junction MTJ, and the second conductive structure 135. An upper contact plug 125 may be formed to penetrate the second dielectric layer 170. The upper contact plug 125 may be connected to the second conductive structure 135. An interconnection 180 may be formed on the second dielectric layer 170. The interconnection 180 may be connected to the upper contact plug 125.

Figure 6:
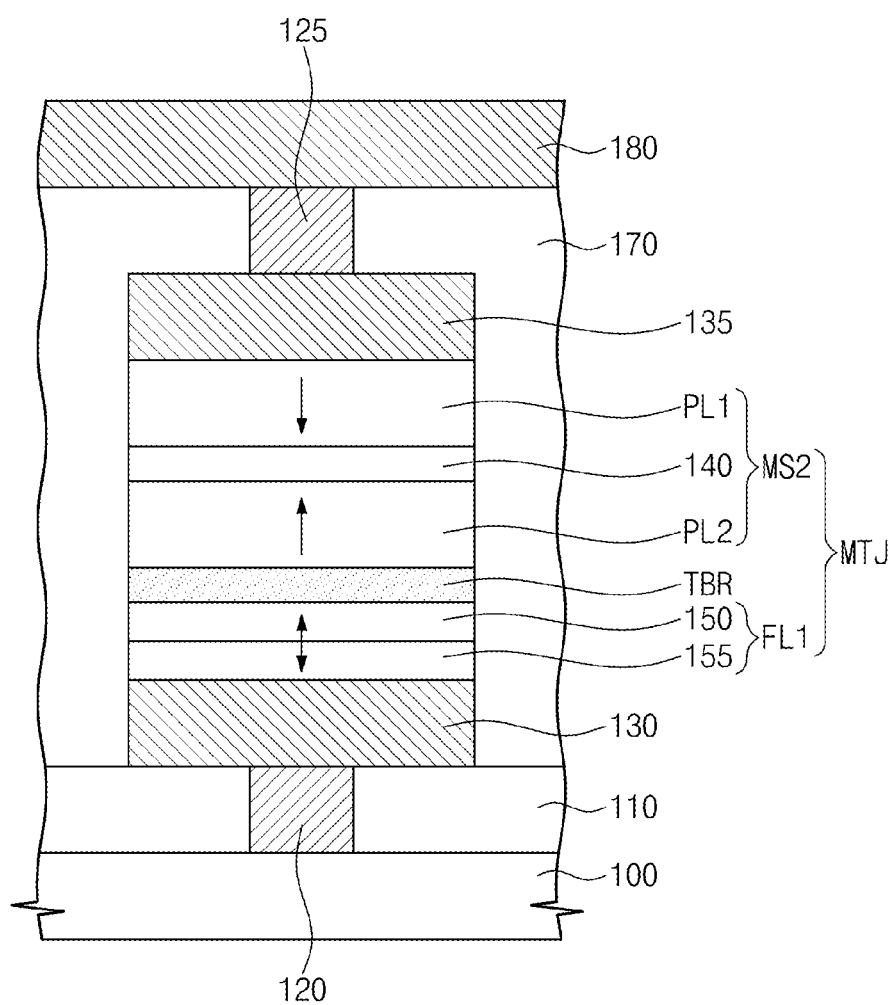
FIG. 6 is a cross-sectional view illustrating a magnetic memory device according to other example embodiments of the inventive concepts.

FIG. 6 is a cross-sectional view illustrating a magnetic memory device according to other example embodiments of the inventive concepts. Referring to FIG. 6, a magnetic tunnel junction MTJ of a magnetic memory device according to the present embodiment may be the second type magnetic tunnel junction MTJ2 of FIG. 3. In an embodiment, a first perpendicular magnetic structure may include a free layer FL1, and a second perpendicular magnetic structure MS2 may include first and second pinned layers PL1 and PL2. In other words, the free layer FL1 may be disposed between a tunnel barrier layer TBR and a first conductive structure 130, unlike the magnetic memory device described with reference to FIG. 4. The first and second pinned layers PL1 and PL2 may be disposed between the tunnel barrier layer TBR and a second conductive structure 135.

The second perpendicular magnetic structure MS2 may include the second pinned layer PL2 on the tunnel barrier layer TBR, the first pinned layer PL1 on the second pinned layer PL2, and an exchange coupling layer 140 between the second and first pinned layers PL2 and PL1. In an embodiment, the capping layer 160 under the second conductive layer 135 may be omitted.

The free layer FL1 of the first perpendicular magnetic structure may include a first free magnetic pattern 150 under the tunnel barrier layer TBR and a second free magnetic pattern 155 under the first free magnetic pattern 150. A boron content of the first free magnetic pattern 150 adjacent to the tunnel barrier layer TBR may be higher than a boron content of the second free magnetic pattern 155 spaced apart from the tunnel barrier layer TBR.

Figure 7:
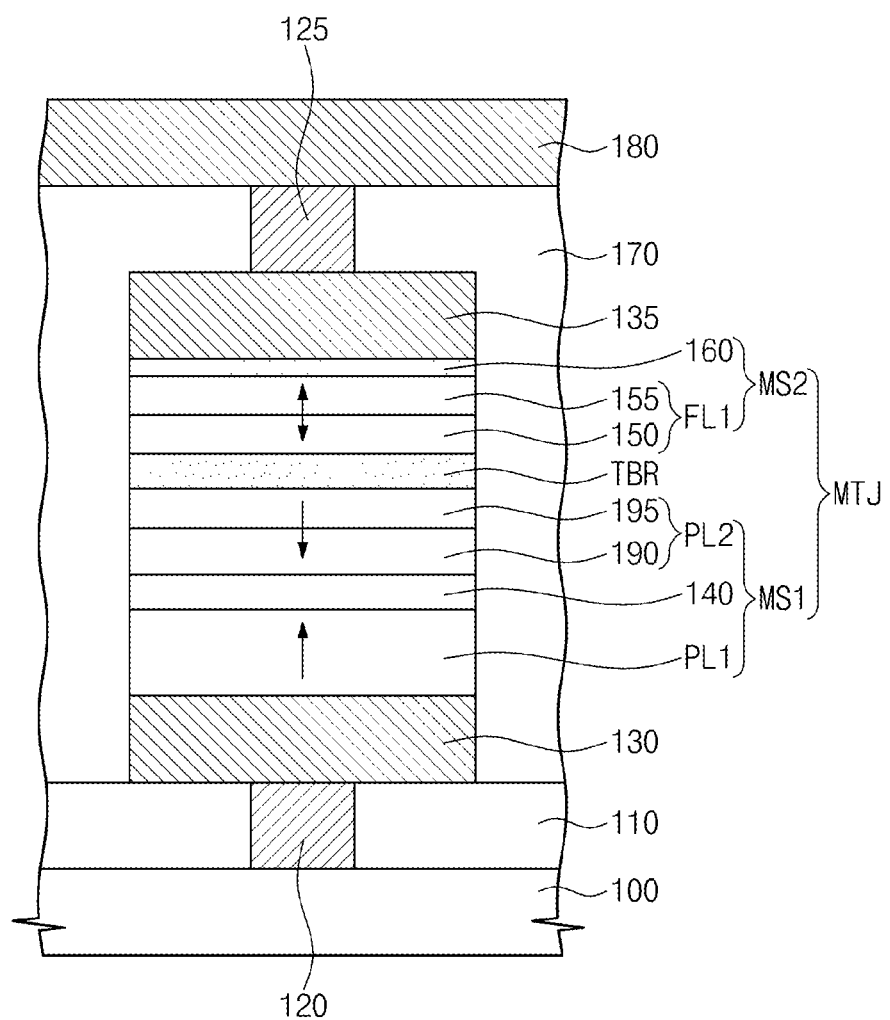
FIGS. 7 to 10 are cross-sectional views illustrating magnetic memory devices according to still other example embodiments of the inventive concepts.

FIG. 7 is a cross-sectional view illustrating magnetic memory devices according to still other example embodiments of the inventive concepts. Referring to FIG. 7, a second pinned layer PL2 adjacent to the tunnel barrier layer TBR may include a polarization enhancement magnetic pattern 195 and a middle magnetic pattern 190. The middle magnetic pattern 190 may be spaced apart from the tunnel barrier layer TBR with the polarization enhancement magnetic pattern 195 interposed therebetween. In other words, the second pinned layer PL2 may have a multi-layered structure. In more detail, the polarization enhancement magnetic pattern 195 may be in contact with the tunnel barrier layer TBR, and the middle magnetic pattern 190 may be in contact with the polarization enhancement magnetic pattern 195.

The polarization enhancement magnetic pattern 195 may include a magnetic material capable of obtaining a high magnetic resistance ratio by contact with the tunnel barrier layer TBR. In addition, the polarization enhancement magnetic pattern 195 may include a magnetic material capable of inducing interfacial perpendicular magnetic anisotropy (i-PMA) at an interface between the tunnel barrier layer TBR and the polarization enhancement magnetic pattern 195. Furthermore, the polarization enhancement magnetic pattern 195 may include an element different from an element included in the middle magnetic pattern 190. In some example embodiments, the polarization enhancement magnetic pattern 195 may include cobalt-iron-boron (CoFeB), and the middle magnetic pattern 190 may include iron-boron (FeB).

A boron content of the middle magnetic pattern 190 may be higher than a boron content of the first pinned layer PL1 and/or a boron content of the polarization enhancement magnetic pattern 195. The boron content of the middle magnetic pattern 190 may be substantially equal to the boron content of the first free magnetic pattern 150. In more detail, the boron content of the middle magnetic pattern 190 may be in a range of 30 at % to 50 at %. In some example embodiments, the boron content of the middle magnetic pattern 190 may be about 40 at %.

In example embodiments of the inventive concepts, when the boron content of the middle magnetic pattern 190 is about 40 at %, the perpendicular magnetic anisotropy of the polarization enhancement magnetic pattern 195 may be improved.

Figure 8:
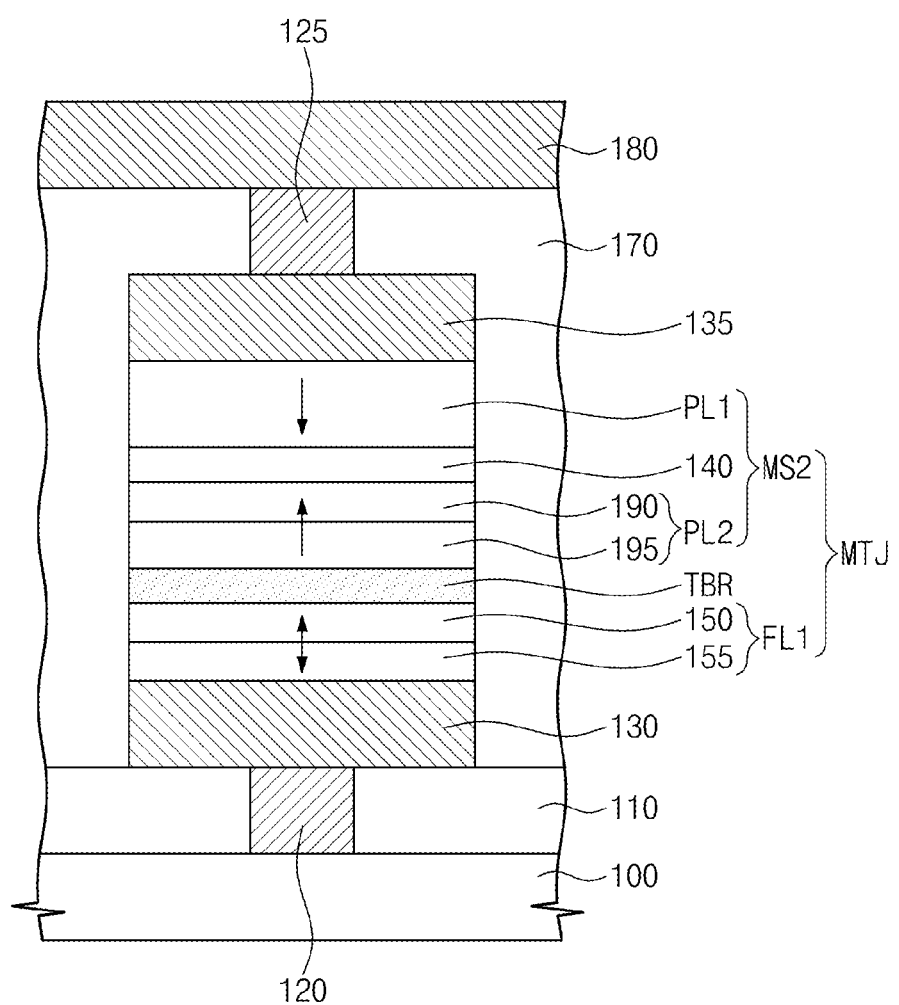

FIG. 8 is a cross-sectional view illustrating magnetic memory devices according to yet other example embodiments of the inventive concepts. Referring to FIG. 8, a magnetic tunnel junction MTJ of a magnetic memory device according to the present embodiment may be the second type magnetic tunnel junction MTJ2 of FIG. 3. In more detail, a first perpendicular magnetic structure may include a free layer FL1, and a second perpendicular magnetic structure MS2 may include first and second pinned layers PL1 and PL2. In other words, unlike the magnetic memory device described with reference to FIG. 4, the free layer FL1 may be disposed between the tunnel barrier layer TBR and the first conductive structure 130, and the first and second pinned layers PL1 and PL2 may be disposed between the tunnel barrier layer TBR and the second conductive structure 135.

The second perpendicular magnetic structure MS2 may include the second pinned layer PL2 on the tunnel barrier layer TBR, the first pinned layer PL1 on the second pinned layer PL2, and an exchange coupling layer 140 between the second and first pinned layers PL2 and PL1. The second pinned layer PL2 may include a polarization enhancement magnetic pattern 195 and a middle magnetic pattern 190 spaced apart from the tunnel barrier layer TBR with the polarization enhancement magnetic pattern 195 interposed therebetween. A boron content of the middle magnetic pattern 190 may be higher than a boron content of the first pinned layer PL1 and/or a boron content of the polarization enhancement magnetic pattern 195. The boron content of the middle magnetic pattern 190 may be substantially equal to the boron content of the first free magnetic pattern 150 of the free layer PL1.

The free layer FL1 of the first perpendicular magnetic structure may include the first free magnetic pattern 150 under the tunnel barrier layer TBR and the second free magnetic pattern 155 under the first free magnetic pattern 150. The boron content of the first free magnetic pattern 150 adjacent to the tunnel barrier layer TBR may be higher than the boron content of the second free magnetic pattern 155 spaced apart from the tunnel barrier layer TBR.

Figure 9:
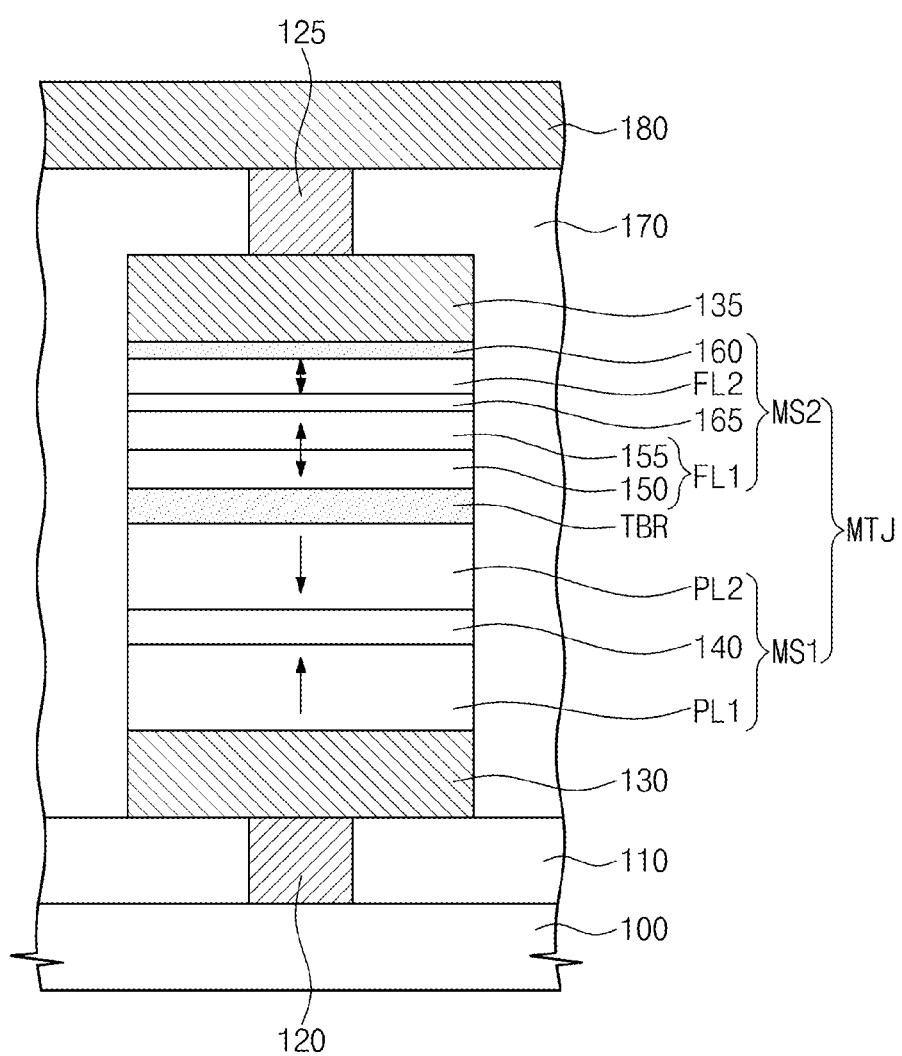

FIG. 9 is a cross-sectional view illustrating magnetic memory devices according to yet still other example embodiments of the inventive concepts. Referring to FIG. 9, a second perpendicular magnetic structure MS2 may include a first free layer FL1, a second free layer FL2 on the first free layer FL1, a non-magnetic metal layer 165 between the first and second free layers FL1 and FL2, and a capping layer 160 on the second free layer FL2.

The non-magnetic metal layer 165 may include a non-magnetic metal material. For example, the non-magnetic metal layer 165 may include at least one of hafnium (Hf), zirconium (Zr), titanium (Ti), tantalum (Ta), or alloys thereof. The second free layer FL2 may be coupled to the first free layer FL1 by the non-magnetic metal layer 165, so the second free layer FL2 may have a perpendicular magnetization direction parallel to the magnetization direction of the first free layer FL1. The non-magnetic metal layer 165 may have a thickness of about 10 Å or less. However, the inventive concepts are not limited thereto. In other example embodiments, the non-magnetic metal layer 165 may be omitted.

The second free layer FL2 may include at least one of iron (Fe), cobalt (Co), nickel (Ni), or alloys thereof. In addition, the second free layer FL2 may further include a non-magnetic material. The non-magnetic material included in the second free layer FL2 may include at least one of tantalum (Ta), titanium (Ti), zirconium (Zr), hafnium (Hf), boron (B), or chromium (Cr). In some example embodiments, the second free layer FL2 may include the non-magnetic material (e.g., boron) and at least one of iron (Fe), cobalt (Co), or nickel (Ni).

A boron content of the second free layer FL2 may be lower than those of the first and second free magnetic patterns 150 and 155 of the first free layer FL1. In some example embodiments, the boron content of the second free layer FL2 may be about 20 at %. A thickness of the second free layer FL2 may be substantially equal to or smaller than a thickness of the first free layer FL1.

The first and second free magnetic patterns 150 and 155 may have an amorphous structure. However, the boron included in the first and second free magnetic patterns 150 and 155 may be diffused into the non-magnetic metal layer 165 and the second free layer FL2 having the relatively low boron content by a thermal treatment process, and thus, the first and second free magnetic patterns 150 and 155 may be crystallized. Since the first and second free magnetic patterns 150 and 155 are crystallized, the TMR characteristics of the magnetic tunnel junction MTJ may be exhibited at an interface between the tunnel barrier layer TBR and the first free layer FL1.

Figure 10:
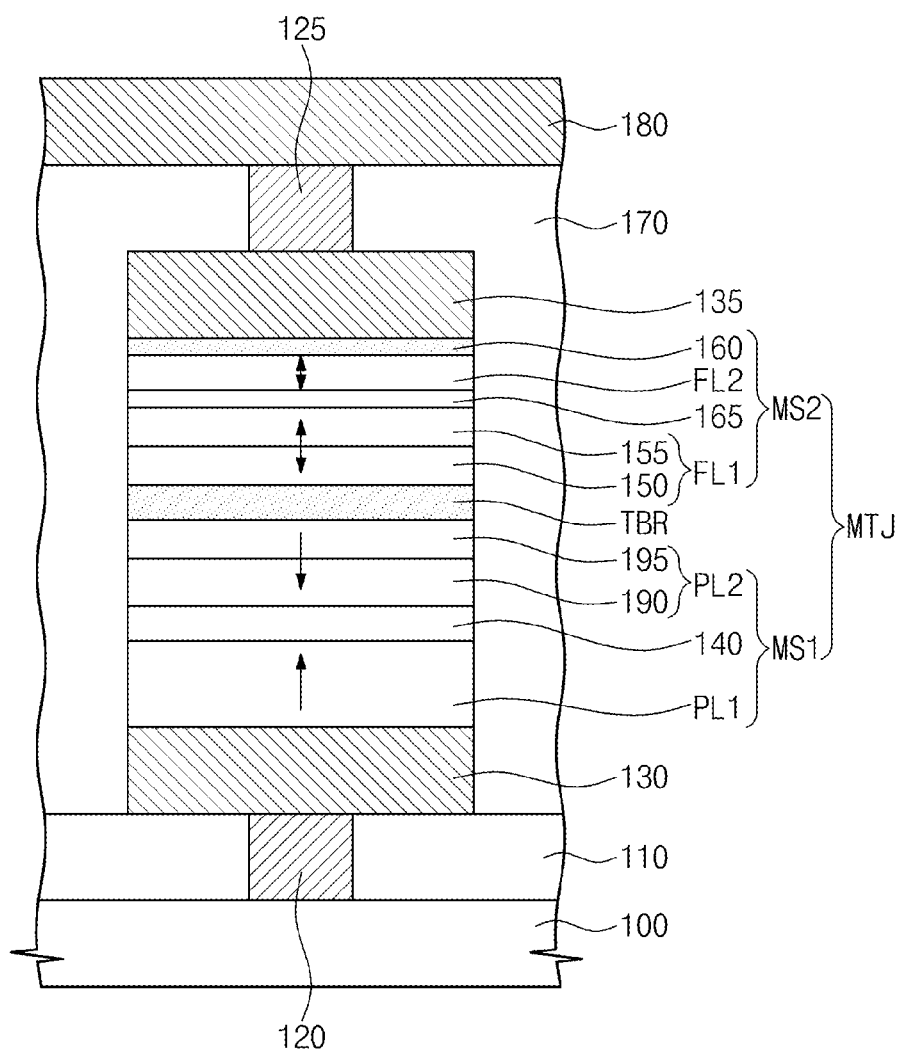

FIG. 10 is a cross-sectional view illustrating magnetic memory devices according to yet still other example embodiments of the inventive concepts.

Referring to FIG. 10, a second pinned layer PL2 adjacent to the tunnel barrier layer TBR may include a polarization enhancement magnetic pattern 195 and a middle magnetic pattern 190 spaced apart from the tunnel barrier layer TBR with the polarization enhancement magnetic pattern 195 interposed therebetween. In other words, the second pinned layer PL2 may have a multi-layered structure. The polarization enhancement magnetic pattern 195 may be in contact with the tunnel barrier layer TBR, and the middle magnetic pattern 190 may be in contact with the polarization enhancement magnetic pattern 195.

The polarization enhancement magnetic pattern 195 may include a magnetic material capable of obtaining a high magnetic resistance ratio by contact with the tunnel barrier layer TBR. In some example embodiments, the polarization enhancement magnetic pattern 195 may include cobalt-iron-boron (CoFeB). The middle magnetic pattern 190 may include iron-boron (FeB). The boron content of the middle magnetic pattern 190 may be higher than the boron content of the first pinned layer PL1 and/or the boron content of the polarization enhancement magnetic pattern 195. The boron content of the middle magnetic pattern 190 may be substantially equal to the boron content of the first free magnetic pattern 150. The boron content of the middle magnetic pattern 190 may be in a range of 30 at % to 50 at %. In some example embodiments, the boron content of the middle magnetic pattern 190 may be about 40 at %.

Figure 12:
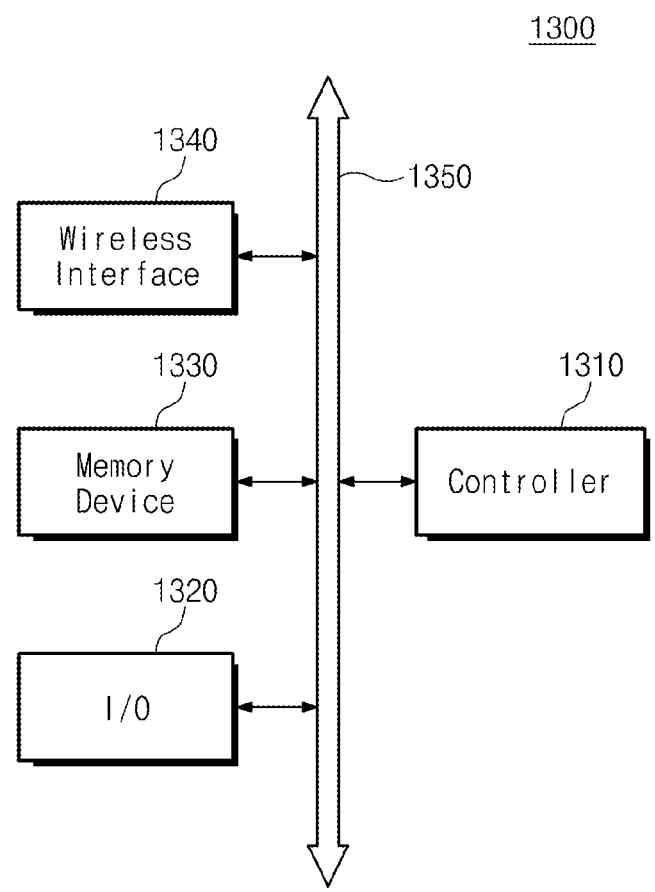
FIGS. 12 and 13 are schematic block diagrams illustrating electronic devices including magnetic memory devices according to example embodiments of the inventive concepts.
Figure 13:
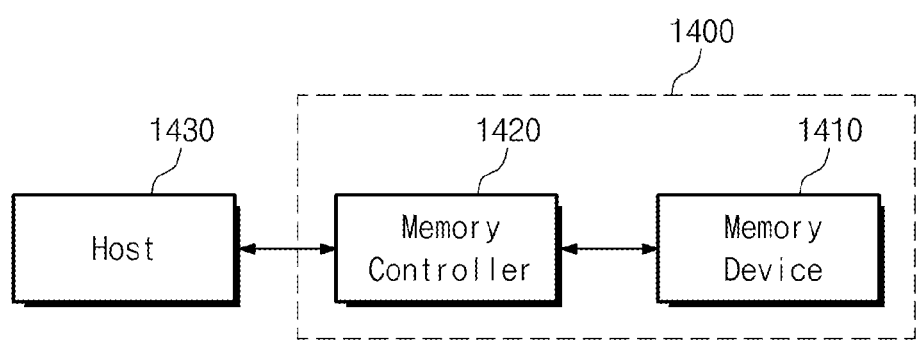

FIGS. 12 and 13 are schematic block diagrams illustrating electronic devices including magnetic memory devices according to example embodiments of the inventive concepts.

Referring to FIG. 12, an electronic device 1300 including the magnetic memory device according to the example embodiments of the inventive concepts may be one of a personal digital assistant (PDA), a laptop computer, a portable computer, a web tablet, a wireless phone, a mobile phone, a digital music player, a cable/wireless electronic device, or any composite electronic device including at least two thereof. The electronic device 1300 may include a controller 1310, an input/output (I/O) device 1320 (e.g., a keypad, a keyboard, or a display), a memory device 1330, and a wireless interface 1340 which are coupled to each other through a data bus 1350. For example, the controller 1310 may include at least one of a microprocessor, a digital signal processor, a microcontroller, or another logic device having a similar function to any one thereof. The memory device 1330 may store, for example, commands to be executed by the controller 1310. Additionally, the memory device 1330 may store user's data. The memory device 1330 may include at least one of the magnetic memory devices in the aforementioned example embodiments of the inventive concepts. The electronic device 1300 may transmit data to a wireless communication network using a radio frequency (RF) signal or receive data from the network by means of the wireless interface 1340. For example, the wireless interface 1340 may include antenna or a wireless transceiver. The electronic device 1300 may be used to realize a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

Referring to FIG. 13, at least one of the magnetic memory devices according to the example embodiments of the inventive concepts may be used to realize a memory system. A memory system 1400 may include a memory device 1410 and a memory controller 1420 that are used to store massive data. The memory controller 1420 may control the memory device 1410 to read/write data from/into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 may include at least one of the magnetic memory devices according to the above example embodiments of the inventive concepts.

The magnetic memory devices described above may be encapsulated using various packaging techniques. For example, the magnetic memory devices according to the aforementioned example embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the magnetic memory device according to one of the above example embodiments is mounted may further include at least one semiconductor device (e.g., a controller and/or a logic device) that controls the magnetic memory device.

The magnetic memory device according to the inventive concepts may include the free layer having the bi-layered structure. Here, one layer, which is in contact with the tunnel barrier layer, of the free layer may have the boron content higher than that of the other of the free layer. Thus, the TMR characteristic and the switching efficiency of the magnetic memory device may be improved. In addition, the resistance of the magnetic memory device to the high-temperature process may be improved.

While the inventive concepts have been described with reference to example embodiments, it will be apparent to those skilled in the art that various changes and modifications may be made without departing from the spirits and scopes of the inventive concepts. Therefore, it should be understood that the above example embodiments are not limiting, but illustrative.

What is claimed is:

1. A memory device comprising:
a magnetic tunnel junction including: a first free layer; a pinned layer; and a tunnel barrier layer between the first free layer and the pinned layer, wherein
the first free layer includes a first free magnetic pattern adjacent to the tunnel barrier layer and a second free magnetic pattern spaced apart from the tunnel barrier layer with the first free magnetic pattern therebetween,
the second free magnetic pattern contacts the first free magnetic pattern,
the first and second free magnetic patterns include boron (B),
a boron content of the first free magnetic pattern is higher than a boron content of the second free magnetic pattern,
the boron content of the first free magnetic pattern is in a range of about 25 at % to about 50 at %, and
the pinned layer includes a first pinned layer adjacent to the tunnel barrier layer, the first pinned layer including,
a polarization enhancement magnetic pattern adjacent to the tunnel barrier layer; and
a middle magnetic pattern spaced apart from the tunnel barrier layer with the polarization enhancement magnetic pattern therebetween, the middle magnetic pattern contacting the polarization enhancement magnetic pattern, and the middle portion having a boron content higher than a boron content of the polarization enhancement magnetic pattern and a boron content of the second pinned layer.

2. The memory device of claim 1, wherein the boron content of the second free magnetic pattern is in a range of about 20 at % to about 35 at %.

3. The memory device of claim 1, wherein a thickness of the first free magnetic pattern is substantially equal to a thickness of the second free magnetic pattern.

4. The memory device of claim 1, wherein a thickness of the first free layer is in a range of about 10 Å to about 20 Å.

5. The memory device of claim 1, wherein the first and second free magnetic patterns include cobalt-iron-boron (CoFeB).

6. The memory device of claim 1, wherein the pinned layer further includes:
a second pinned layer spaced apart from the tunnel barrier layer with the first pinned layer therebetween,
wherein the first and second pinned layers include boron, and
wherein a boron content of the first pinned layer is higher than a boron content of the second pinned layer.

7. The memory device of claim 6, wherein the boron content of the middle magnetic pattern is substantially equal to the boron content of the first free magnetic pattern.

8. The memory device of claim 6, wherein the middle magnetic pattern includes iron-boron (FeB).

9. The memory device of claim 1, wherein the magnetic tunnel junction further includes:
a non-magnetic metal layer adjacent to the first free layer; and
a second free layer spaced apart from the first free layer with the non-magnetic metal layer therebetween,
wherein the boron contents of the first and second free magnetic patterns are higher than a boron content of the second free layer.

10. The memory device of claim 9, wherein a thickness of the first free layer is substantially equal to or greater than a thickness of the second free layer.

11. The memory device of claim 9, wherein the magnetic tunnel junction further comprises:
 a capping layer spaced apart from the non-magnetic metal layer with the second free layer therebetween,
 wherein the capping layer contacts one surface of the second free layer to induce interfacial perpendicular magnetic anisotropy (i-PMA).

12. The memory device of claim 1, wherein the magnetic tunnel junction is on a substrate, and
 wherein the pinned layer is between the substrate and the tunnel barrier layer.

13. The memory device of claim 1, wherein the magnetic tunnel junction is on a substrate, and
 wherein the first free layer is between the substrate and the tunnel barrier layer.

14. The memory device of claim 1, wherein the boron content of the first free magnetic pattern is about 40 at %.

15. A memory device comprising:
 a magnetic tunnel junction including: a free layer, a pinned layer, and a tunnel barrier layer between the free layer and the pinned layer, wherein
  the free layer includes a first free magnetic pattern adjacent to the tunnel barrier layer and a second free magnetic pattern spaced apart from the tunnel barrier layer with the first free magnetic pattern therebetween,
  the second free magnetic pattern contacts the first free magnetic pattern,
  the first and second free magnetic patterns include cobalt-iron-boron (CoFeB),
  a boron content of the first free magnetic pattern is higher than a boron content of the second free magnetic pattern, and
  the pinned layer includes,
   a polarization enhancement magnetic pattern adjacent to the tunnel barrier layer; and
   a middle magnetic pattern spaced apart from the tunnel barrier layer with the polarization enhancement magnetic pattern therebetween, the middle magnetic pattern contacting the polarization enhancement magnetic pattern, the middle magnetic pattern including iron-boron (FeB), and the middle portion having a boron content that is substantially equal to the boron content of the first free magnetic pattern.

* * * * *